(12) United States Patent
Bataineh

(10) Patent No.: US 7,761,776 B1
(45) Date of Patent: Jul. 20, 2010

(54) METHOD AND APPARATUS FOR A MODULAR, PROGRAMMABLE CYCLIC REDUNDANCY CHECK DESIGN

(75) Inventor: Khaldoun Bataineh, Austin, TX (US)

(73) Assignee: XILINX, Inc., San Jose, CA (US)

( * ) Notice: Subject to any disclaimer, the term of this patent is extended or adjusted under 35 U.S.C. 154(b) by 890 days.

(21) Appl. No.: 11/265,815

(22) Filed: Nov. 3, 2005

(51) Int. Cl.
*H03M 13/00* (2006.01)

(52) U.S. Cl. ............... 714/774; 714/781; 714/758

(58) Field of Classification Search ........ 714/781, 714/758, 774
See application file for complete search history.

(56) References Cited

U.S. PATENT DOCUMENTS

| | | | |
|---|---|---|---|
| 3,678,469 A * | 7/1972 | Freeman et al. ............. 714/779 |
| 5,323,402 A * | 6/1994 | Vaccaro et al. ............. 714/782 |
| 6,467,063 B1 * | 10/2002 | Fukuoka ..................... 714/784 |
| 6,530,057 B1 * | 3/2003 | Kimmitt ..................... 714/758 |
| 6,647,528 B1 | 11/2003 | Collette et al. |
| 6,671,832 B1 | 12/2003 | Apisdorf |
| 6,820,228 B1 * | 11/2004 | Keller ........................ 714/757 |
| 6,938,197 B2 | 8/2005 | Doubler et al. |
| 7,139,963 B1 | 11/2006 | Fox |
| 7,191,383 B2 * | 3/2007 | Lin et al. .................... 714/774 |
| 2003/0097628 A1 | 5/2003 | Ngo et al. |

OTHER PUBLICATIONS

Borrelli, Chris; "IEEE 802.3 Cyclic Redundancy Check," XAPP209, Mar. 23, 2001, pp. 1-8, (v1.0), available from Xilinx, Inc., 2100 Logic Drive, San Jose, CA 95124.
Xilinx, Inc., "RocketIO TM Transceiver User Guide," UG024, Dec. 9, 2004, pp. 1-156, (v2.5), available from Xilinx, Inc., 2100 Logic Drive, San Jose, CA 95124.
U.S. Appl. No. 11/032,396 filed Jan. 10, 2005, Bataineh, Khaldoun, Xilinx, Inc., 2100 Logic Drive, San Jose, CA 95124.
U.S. Appl. No. 11/032,396, filed Jan. 10, 2005.

* cited by examiner

*Primary Examiner*—Joseph D Torres
(74) *Attorney, Agent, or Firm*—Michael T. Wallace; Kin-Wah Tong; Thomas George (57) ABSTRACT

A linear feedback shift register (LFSR) based design is applied to cyclic redundancy check (CRC) modules, in which a CRC building block having a minimum width is implemented. The CRC building block accepts a generator polynomial as an input design parameter to build a CRC block module. The modularity of the design then allows a larger CRC block design to be constructed from multiple CRC block modules such that wider data width blocks may be accommodated. The LFSR based designs are extended to communication systems that may require scrambling and descrambling functionality.

9 Claims, 7 Drawing Sheets

METHOD AND APPARATUS FOR A MODULAR, PROGRAMMABLE CYCLIC REDUNDANCY CHECK DESIGN

FIELD OF THE INVENTION

The present invention generally relates to linear feedback shift registers (LFSR), and more particularly to applications of the LFSRs.

BACKGROUND

Data communication systems continue to require advanced methods of error detection of digital data being communicated over a noisy channel. In some cases when an error is detected, it is corrected, in other cases a retransmission of the data is needed Cyclic redundancy check (CRC) codes have often been employed by digital communication systems to implement such error detection. CRCs may be calculated using a serial process, e.g., using an LFSR, in which single bits of a frame of data are accumulated one cycle at a time, to generate a frame check sequence (FCS) to be appended to the end of the data frame to be transmitted. The concatenation of the data frame with the FCS is designed to be exactly divisible by some predefined polynomial. Thus, if the original data frame to be transmitted is k bits long and the FCS is n bits long, then the total number of bits to be transmitted is k+n bits. The received k+n bits may then be divided by the predefined polynomial to insure that the division results in zero remainder. If a non-zero remainder does exist, however, then an error is detected between the bits received and the bits transmitted.

In order to accommodate large data frames, the CRCs may be expanded from the ability to handle single bits of data at each clock cycle, to the ability to handle multiple data bits, or words, in a single clock cycle. In order to generate CRCs for data words having widths greater than one bit, however, a different CRC circuit is required for each data word width that is to be processed.

In particular, communication protocols often utilize data packets having any number of data bytes. Given that each data byte represents 8 bits, for example, then performing CRC calculations on each data byte requires an 8-bit CRC circuit. Should CRC calculations be required on larger data blocks, however, a possibility exists that an un-processed data residue whose width is smaller than the current CRC handling width would need to be included in the current CRC calculation.

In such an instance, multiple CRC blocks having multiple widths would need to be incorporated into the design to handle the data residue widths that may be possible. For example, given a data block having a maximum width of 64 bits, CRC blocks having widths of 56, 48, 40, 32, 24, 16, and 8 bits would be necessary to handle the data residue widths that may result during CRC processing. Such a design could be size prohibitive.

Furthermore, other scenarios exist where data is received having varying widths, but real time CRC, processing on the variable width data blocks is still required. In such an instance, a first-in, first-out (FIFO) structure would be necessary to buffer the incoming data, but the possibility of varying data residue widths still remains.

SUMMARY

To overcome limitations in the prior art, and to overcome other limitations that will become apparent upon reading and understanding the present specification, the various embodiments of the present invention disclose an apparatus and method for a programmable, modular cyclic redundancy check (CRC) generator, where a polynomial is defined as an input to the CRC design. The modular design allows building a particular design using smaller CRC building blocks and increasing the width capability of the CRC design by concatenation of a plurality of the CRC building blocks.

In accordance with one embodiment of the invention, a programmable modular cyclic redundancy check (CRC) circuit comprises a variable number of multiplier circuits coupled in series. Each multiplier circuit is coupled to receive a generator polynomial and a portion of an input data word and is adapted to multiply the portion of the input data word by the generator polynomial to provide a result having a data width equal to an order of the generator polynomial. The variable number of multiplier circuits is determined to be equal to a ratio of an input data word width to a width of the portion of the input data word. The programmable modular CRC circuit further comprises a register circuit that is coupled to receive the result from each of the plurality of multiplier circuits and is adapted to select a final CRC result from a last multiplier circuit of the variable number of multiplier circuits.

In accordance with another embodiment of the invention, a method of adapting a programmable modular cyclic redundancy check (CRC) circuit to an input data width comprises defining a generator polynomial for use in each multiplier module of the CRC circuit, defining a multiplier data width to be processed by each multiplier module, determining a number of multiplier modules required to accommodate the input data width, serially cascading the determined number of multiplier modules, and coupling a portion of the input data width to each cascaded multiplier module, where a width of each portion of the input data width is equal to the multiplier data width.

In accordance with another embodiment of the invention, a method of performing a cyclic redundancy check (CRC) comprises generating one or more CRC modules, where each CRC module is capable of performing a CRC operation on a portion of an input data word in accordance with a CRC polynomial. The method further comprises cascading the one or more CRC modules to generate a final CRC result of the input data word.

BRIEF DESCRIPTION OF THE DRAWINGS

Various aspects and advantages of the invention will become apparent upon review of the following detailed description and upon reference to the drawings in which.

DETAILED DESCRIPTION

Generally, the various embodiments of the present invention are applied to the field of LFSR based designs. In one embodiment, an LFSR based design is applied to a cyclic redundancy check (CRC) module, in which a CRC building block having a minimum width is implemented. The CRC building block uses a generator polynomial to build a CRC block module. The modularity of the design then allows a larger CRC block design to be constructed from multiple CRC block modules such that wider data width blocks may be accommodated. An added flexibility of the design is to have the generator polynomial programmable as an input design parameter, which allows the same CRC circuit to be used with different standards or user defined generator polynomials. LFSR based designs may also be applied to any communication that may require scrambling and descrambling. Scrambling applications are particularly facilitated, since programmable generator polynomials are accommodated.

Figure 1:
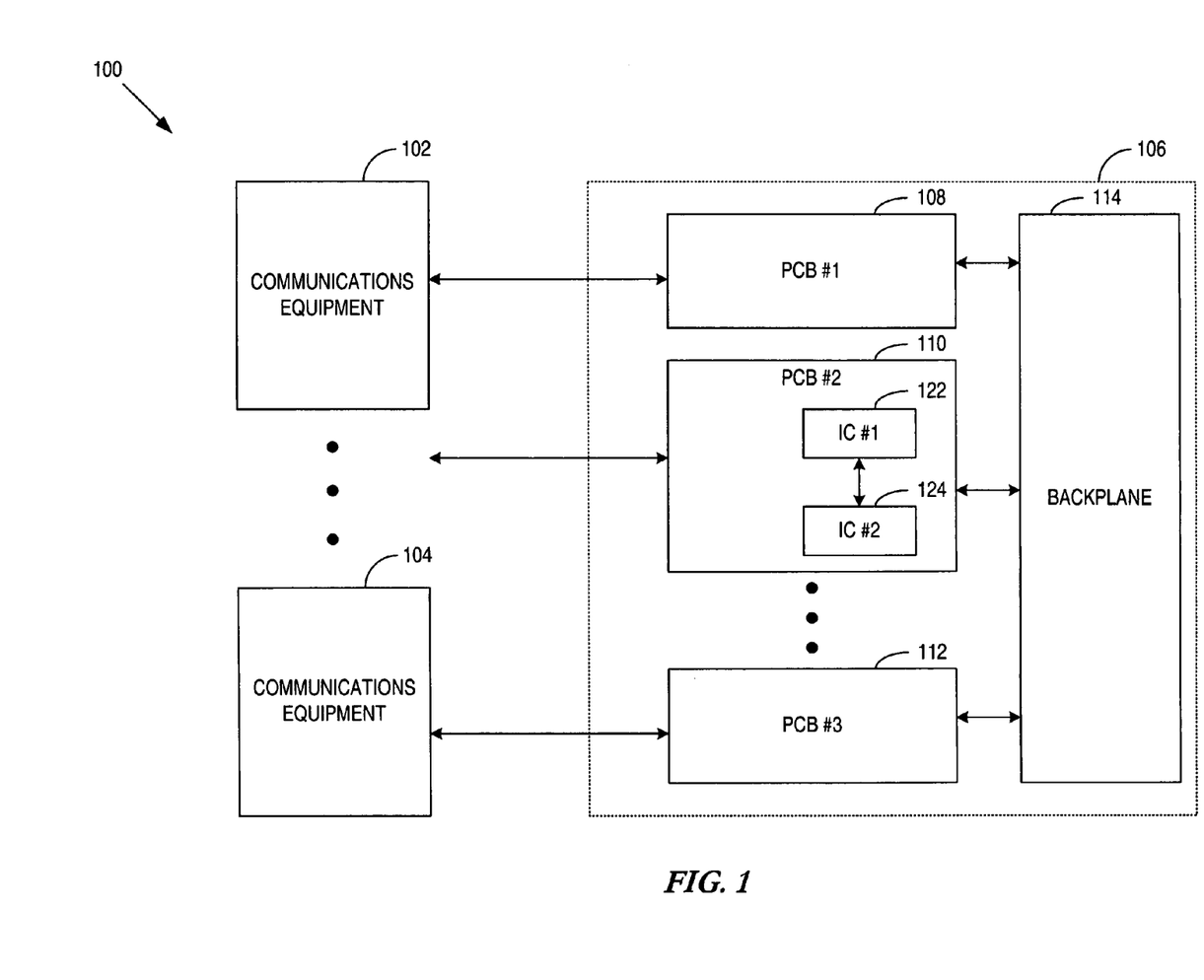
FIG. 1 illustrates an exemplary communication system.

Communication system 100 of FIG. 1, for example, is illustrated in which programmable, modular CRC designs may be utilized. Communications equipment blocks 102-106 may represent communicating entities, in which communication takes place at various levels and distances using various wired and/or wireless technologies.

Communications equipment blocks 102-104, for example, may communicate with communications block 106 via a Local Area Network (LAN) or Storage Network (SN) using technologies such as 1 Gigabit Ethernet, or 10 Gigabit Ethernet, as specified by IEEE 802.3. Communication system 100 may designate a data center, storage network, or System Area Network (SAN), in which the Infiniband serial I/O interconnect architecture, or Fiber Channel, is utilized. Conversely, communication system 100 may represent a Synchronous Optical NETwork (SONET) or Synchronous Digital Hierarchy (SDH) employed by many Internet Service Providers (ISPs) and other high bandwidth end users.

Still other communication technologies supported by communication system 100 may include Peripheral Component Interconnect (PCI), PCI-Express, RapidIO, and Serial Advanced Technology Attachment (ATA). Such communication standards may be implemented, for example, to support communications between Printed Circuit Boards (PCBs) 108-112, Integrated Circuits 122-124, and backplane 114. As can be recognized by one of ordinary skill in the art, any number of communication standards may be supported as is discussed in more detail below.

Figure 2:
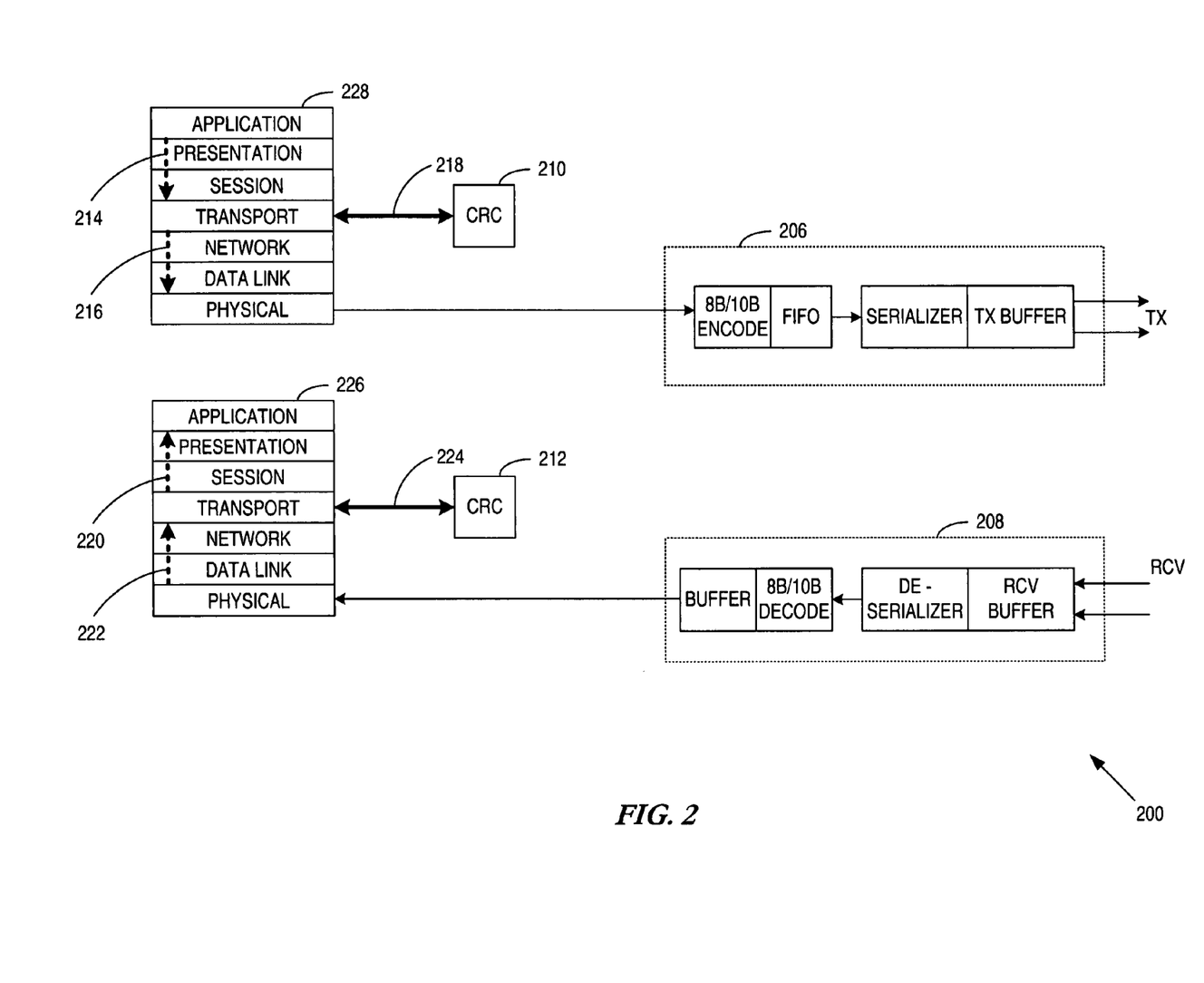
FIG. 2 illustrates an exemplary cyclic redundancy check (CRC) application.

Turning to FIG. 2, exemplary communication block diagram 200 is illustrated in which transmitter 206 and receiver 208 conduct serial communications with external communications equipment (not shown). Communication stacks 228 and 226 may be associated with any number of communication protocols that may be operated to support the communication. CRC blocks 210 and 212 are positioned such that communication links 218 and 224 may establish a connection with communication stacks 228 and 226, respectively, via any one of their respective open systems interconnection (OSI) layers as illustrated. For exemplary purposes only, communication link 218 establishes a connection between CRC 210 and communication stack 228, via the transport layer of communication stack 228. Similarly, communication link 224 establishes a connection between CRC 212 and communication stack 226, via the transport layer of communication stack 226.

Using such an arrangement, outbound data frames may propagate from, for example, the application layer to the transport layer of communication stack 228 via communication path 214. Providing that the particular communication protocol in use requires CRC processing on the transport layer, communication path 218 supplies the data frames to CRC block 210 from the transport layer.

The data frames received by CRC block 210 are treated as a single binary word, $M_1$, and then processed by using a key word, $k_1$. The remainder, $r_1$, left after passing $M_1$ through the CRC process that is controlled by $k_1$, constitutes the residue for the given data frame. The remainder is then passed back to the transport layer via communication link 218 and ultimately passed down to the physical layer via communication link 216 after it is appended to the original word M1. Transmitter 206 then sends both the message string, $M_1$, and the residue, $r_1$, to the external communications equipment (not shown).

The external communications equipment (not shown) completes the communication link by transmitting data frames to be received by receiver 208. Communication path 222 of communication stack 226 then delivers the received data frames, $M_2$, to, for example, its transport layer. The transport layer then delivers the received data frames to CRC 212 via communication path 224. CRC 212 checks the data by performing the same calculation, i.e., processing $M_2$ by the same key word $k_1$, and verifying that the residue, $r_2$, received with data frame $M_2$, is equal to the residue transmitted by the external communications equipment (not shown). Alternatively, verification of the residue, $r_2$, could be performed by communication stack 226 as well. Once completed, the verified data frames are then provided to the end application via communication path 220.

Figure 3:
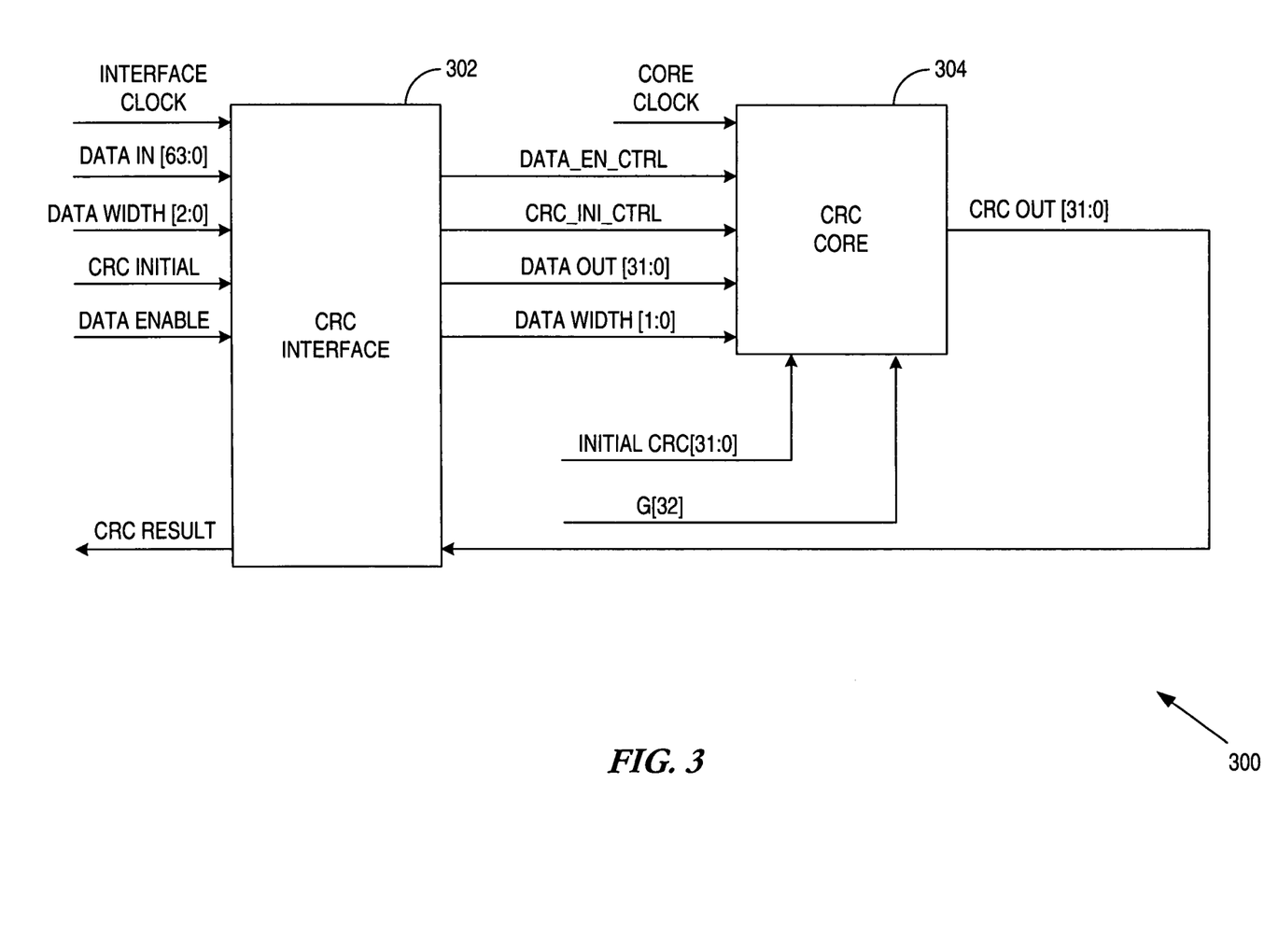
FIG. 3 illustrates an exemplary cyclic redundancy check (CRC) block diagram.

Turning to FIG. 3, an exemplary CRC block diagram 300 illustrates one embodiment of CRC blocks 210 and 212 of FIG. 2. CRC interface 302 may be configured, for example, to receive up to a 64-bit wide data word, DATA IN[63:0], that is most significant bit (MSB) justified. That is to say that for data widths less than 64 bits, the valid data bit positions within DATA IN[63:0] are aligned from MSB to least significant bit (LSB). A 48 bit data width, for example, occupies bit positions [63:16], whereas bit positions [15:0] are left unoccupied or otherwise in an indeterminate state. Different data alignments may be implemented using a programmable selection of alignment, where the input data may be, for example, LSB justified.

Signal DATA WIDTH[2:0] is operative to indicate the number of active data bytes contained within DATA IN[63:0], where a data byte is defined to be equal to 8 bits. Since there are 8, 8-bit data bytes contained within a 64-bit data word, a 3-bit binary control word, DATA WIDTH[2:0] is effective to uniquely activate/deactivate each 8-bit data byte. Should a 40-bit data width be desired, for example, DATA WIDTH[2:0] takes on a binary value of "101" to indicate that the 5 most significant 8-bit data bytes are to be activated within DATA IN[63:0].

CRC core 304, on the other hand, is configured, for example, to receive up to a 32-bit wide data word, DATA OUT[31:0], and a corresponding 2-bit binary control word, DATA WIDTH CTRL[1:0], that is used to designate which of the 4, 8-bit data bytes are to be activated within DATA OUT [31:0]. Signal INTERFACE CLOCK may run at the same frequency as signal CORE CLOCK for active data widths from 8 bits to 32 bits. For active data widths from 40 bits to 64 bits, on the other hand, signal INTERFACE CLOCK operates at half the frequency of signal CORE CLOCK, since two CRC calculations are required of CRC core 404 for each received data word, DATA IN[63:0].

Alternatively, signal INTERFACE CLOCK may run at half the speed of signal CORE CLOCK for data widths equal to or less than 32 bits, where the data block is not an integer multiple of the used data width. In such an instance, for example, if the data block is 136 bits and the used data width is 56 bits, then after two full cycles, 24 bits remain to be processed. Thus, since the originally used data width to be processed is greater than 32 bits, signal INTERFACE CLOCK runs at half the speed of signal CORE CLOCK.

In operation, CRC interface 302 receives up to a 64-bit wide data word every INTERFACE CLOCK cycle, wherein up to 8, 8-bit words may be activated at once. Up to 32 bits of the total number of activated bits are transferred to CRC core 304 in a single clock cycle of CORE CLOCK via DATA OUT[31:0]. Signal DATA WIDTH CTRL[1:0] determines the particular CRC to be performed, whereby an 8-bit, 16-bit, 24-bit, or a 32-bit CRC calculation is performed by CRC core 304. Signal G[32] denotes the generator polynomial that is accepted by CRC core 304 as an input design parameter that is used to define CRC core 304 as a particular CRC block.

Signal CRC INITIAL denotes the start of the data packet to be processed and causes CRC core 304, via CRC_INI_CTRL, to be initialized with INITIAL CRC[31:0] in accordance with the particular CRC block being implemented. Signal DATA ENABLE, in conjunction with signal DATA_EN_CTRL, is used to start and stop CRC calculations between data packets, or even within a packet, if a stop calculation is required. Both intermediate and final CRC results are generated through CRC interface 302 as discussed in more detail below.

Through the use of generator polynomials, results may be calculated using Galois Fields, where mathematical operations are performed bitwise modulo-2 on the binary expressions that represent the generator polynomial. Taking for example, the IEEE CRC-32 polynomial that is implemented by the Ethernet standard, it is defined as:

$$G(CRC\text{-}32)=x^{32}+x^{26}+x^{23}+x^{22}+x^{16}+x^{12}+x^{11}+x^{10}+x^{8}+x^{7}+x^{5}+x^{4}+x^{2}+x^{1}+1 \quad (1)$$

the coefficients of which may be represented in binary form as:

$$g[31:0]=0000\ 0100\ 1100\ 0001\ 0001\ 1101\ 1011\ 0111 \quad (2)$$

Addition (and subtraction) within the Galois Field is implemented as the binary XOR operator, while multiplication within the Galois Field is implemented as the binary AND operator.

The G(CRC-32) polynomial is irreducible, thus it has a finite number of elements in the Galois Field, i.e., $2^{32}$-1. The first 32 elements $\alpha^0$=0000 0000 0000 0000 0000 0000 0000 0001 to $\alpha^{31}$=1000 0000 0000 0000 0000 0000 0000 000 within the G(CRC-32) field are of particular interest because each vector contains only a single binary "1" in its binary representation. Multiply operations using the first 32 elements in the G(CRC-32) space, therefore, are relatively simple to implement, even though the multiplication must still be performed modulo G(x). In general, however, a programmable generator polynomial takes advantage of the fact that the number of bits processed at a time by the CRC is less than the order of the generator polynomial, which may lead to terms that can be much less complicated.

Figure 4:
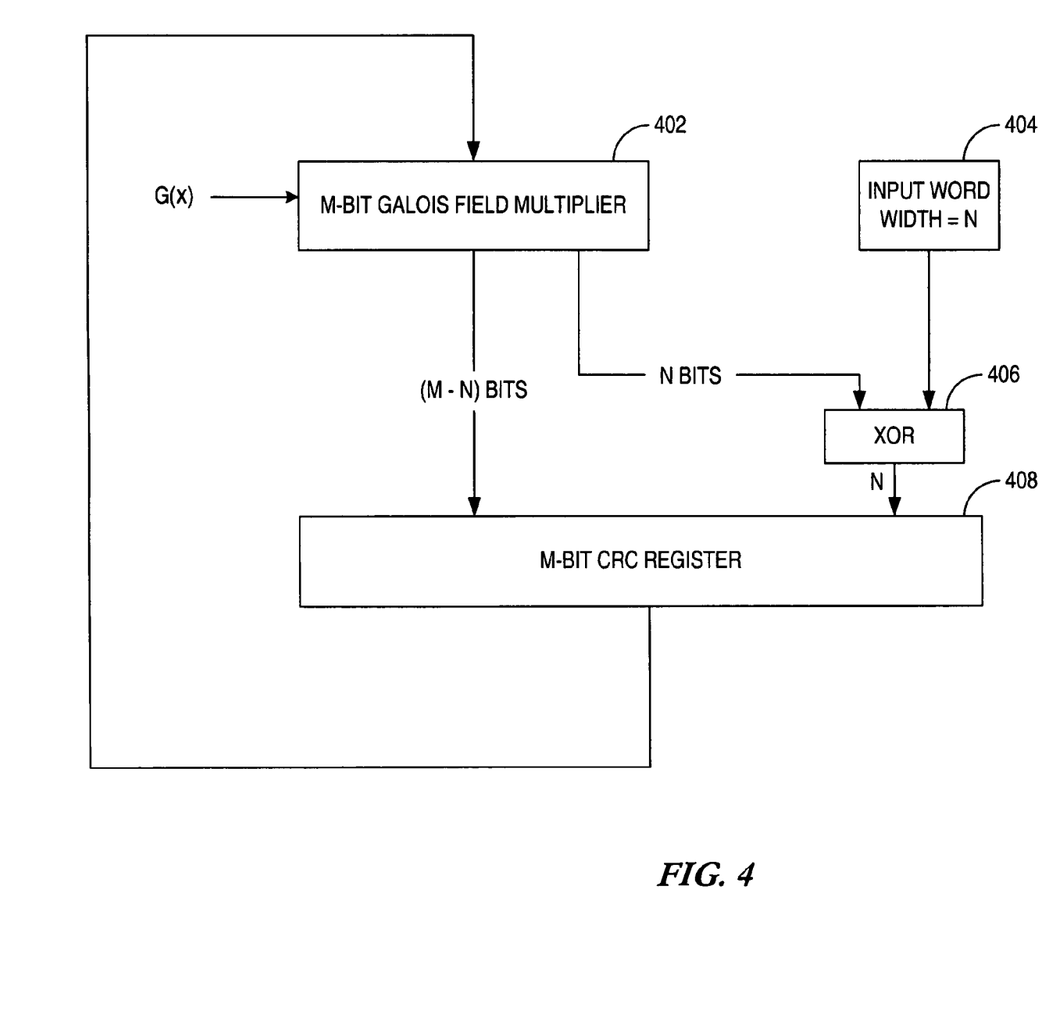
FIG. 4 illustrates an exemplary block diagram of a Galois Field implementation of a CRC generator.

As discussed above, the special characteristics of the Galois Field may be used to calculate the CRC. FIG. 4 illustrates an exemplary block diagram for CRC calculation where N is less than M. The generator polynomial used may be an N-bit Galois field multiplier polynomial. As such, Galois Field mathematics may be used to generate the M-bit result contained within M-bit CRC register 408.

In operation, during the previous TX WORD CLOCK period, either a previous result is calculated and stored within M-bit CRC register 408, or an appropriate Galois Field pattern is used to initialize M-bit CRC register 408. During the next TX WORD CLOCK period, the next N-bit word is presented as input word 404. Given the requirement that N is to be less than or equal to M, calculation of the remainder of the division of input word 404 is trivial. In particular, N is less than M, thus no division is necessary and the remainder is the input word 404 itself multiplied by the N-bits of the Galois Field Multiplier.

Thus, input word 404 merely needs to be appended onto the current contents of M-bit CRC register 408, CURRENT$_{408}$, to calculate the remainder. A corresponding shift must then take place in order to make room for the next N-bit word, NEXT$_{408}$. Since CURRENT$_{408}$ is a vector of the Galois Field, CURRENT$_{408}$ must be multiplied by $\alpha^N$ to take care of the shift and then added to the next N-bit word as follows:

$$\text{NEXT}_{408} = \text{CURRENT}_{408} \otimes \alpha^N \oplus B_{(T+1)} \quad (3)$$

where $B_{(T+1)}$ is input word 404.

If, for example, the next N-bit word consists of 8 bits, then in a 32-bit example, the Galois Field multiplier applied by 32-bit Galois Field multiplier 402 would be $\alpha^8$, whose binary equivalent is:

$$0000\ 0000\ 0000\ 0000\ 0000\ 0001\ 0000\ 0000 \quad (4)$$

Thus, the multiplication itself merely consists of padding 8 binary 0's to the LSB side of CURRENT$_{408}$ because multiplication by $\alpha^8$ is equivalent to a shift left by 8. Since the multiplication must be modulo-G(x), however, the result of the multiplication must not exceed 32 bits. Accordingly, for each binary "1" in CURRENT$_{408}$ that is shifted to the left of the $32^{nd}$ bit position, CURRENT$_{408}$ must be subtracted, i.e., using a binary XOR operation, so that the result does not exceed 32 bits. Finally, since CRC assumes a pre-multiplication of the data by the degree of the generator polynomial when the last byte is received, logic 0s must be pushed as data to finish the CRC computation.

As an example, a 4-bit data width design is considered along with, for example, a generic 32 bit generator polynomial. That is to say, that input word 404 has a width, N, equal to 4 bits. Prior to execution, register 408 is either initialized with an appropriate Galois Field element, INITIAL_CRC [31:0], or the value within register 408 represents the last value calculated for the previous data word accepted, which is itself an appropriate Galois Field element within the $2^{32-1}$ Galois Field space. In either instance, data bits within register 408 are denoted as FCS$_{31}$-FCS$_0$.

Once a new, 4-bit data word 404 has arrived, intermediate 32 bit FCS values, for example, $I_{31}$-$I_{28}$, are calculated using Galois Field methods as follows:

$I_{31}$=FCS$_{31}$;

$I_{30}$=g$_{31}$&FCS$_{31}$$\otimes$FCS$_{30}$;

$I_{29}$=g$_{30}$&FCS$_{30}$$\otimes$g$_{31}$&FCS$_{31}$$\otimes$g$_{31}$&FCS$_{30}$$\otimes$FCS$_{29}$;

$I_{28}$=g$_{29}$&FCS$_{31}$$\otimes$g$_{30}$&FCS$_{30}$$\otimes$g$_{31}$&FCS$_{31}$$\otimes$g$_{31}$&FCS$_{30}$$\otimes$g$_{31}$&FCS$_{29}$$\otimes$FCS$_{28}$ $\quad$ (5)

where & is the logical AND operator, $\otimes$ is the logical XOR operator, and g$_x$ are the bit values for the generator polynomial in use. Once intermediate values have been calculated, the next CRC values corresponding to the D$_3$-D$_0$ data input word are calculated as follows:

CRC$_{next0}$=D$_0$$\otimes$I$_{28}$;

CRC$_{next1}$=D$_1$$\otimes$(I$_{28}$&g$_1$)$\otimes$I$_{29}$;

CRC$_{next2}$=D$_2$$\otimes$(I$_{28}$&g$_2$)$\otimes$(I$_{29}$&g$_1$)$\otimes$I$_{30}$;

CRC$_{next3}$=D$_3$$\otimes$(I$_{28}$&g$_3$)$\otimes$(I$_{29}$&g$_2$)$\otimes$(I$_{30}$&g$_1$)$\otimes$I$_{31}$ $\quad$ (6)

For indices 4-31, $CRC_{nexti}$ are calculated as follows:

$$CRC_{nexti} = CRC_{i-4} \oplus (I_{28} \& g_i) \oplus (I_{29} \& g_{i-1}) \oplus (I_{30} \& g_{i-2}) \oplus (I_{31} \& g_{i-3}) \quad (7)$$

Applying the previous discussion for the CRC-32 generator polynomial would result in $$CRC_{next0} = D_0 \oplus CRC_{28};$$

$$CRC_{next1} = D_1 \oplus CRC_{29};$$

$$CRC_{next2} = D_2 \oplus CRC_{30};$$

$$CRC_{next3} = D_3 \oplus CRC_{31} \quad (8)$$

For indices 4-31, $CRC_{nexti}$ are calculated as follows:

$$CRC_{nexti} = CRC_{i-4} \quad (9)$$

Where the CRCi with i=0 to 31 are the results of the Galois Field Multiplier as discussed previously.

As discussed above, the width of input word 404, N, should be kept less than or equal to the order of the Galois Field polynomial being used, e.g., N<=32. In order to accommodate wider data widths, a modular structure is provided that allows the concatenation of CRC calculation blocks to extend the allowable data width of input word 404 to virtually any data width that may be desirable. The block diagram of FIG. 5 exemplifies such a modular structure.

Figure 5:
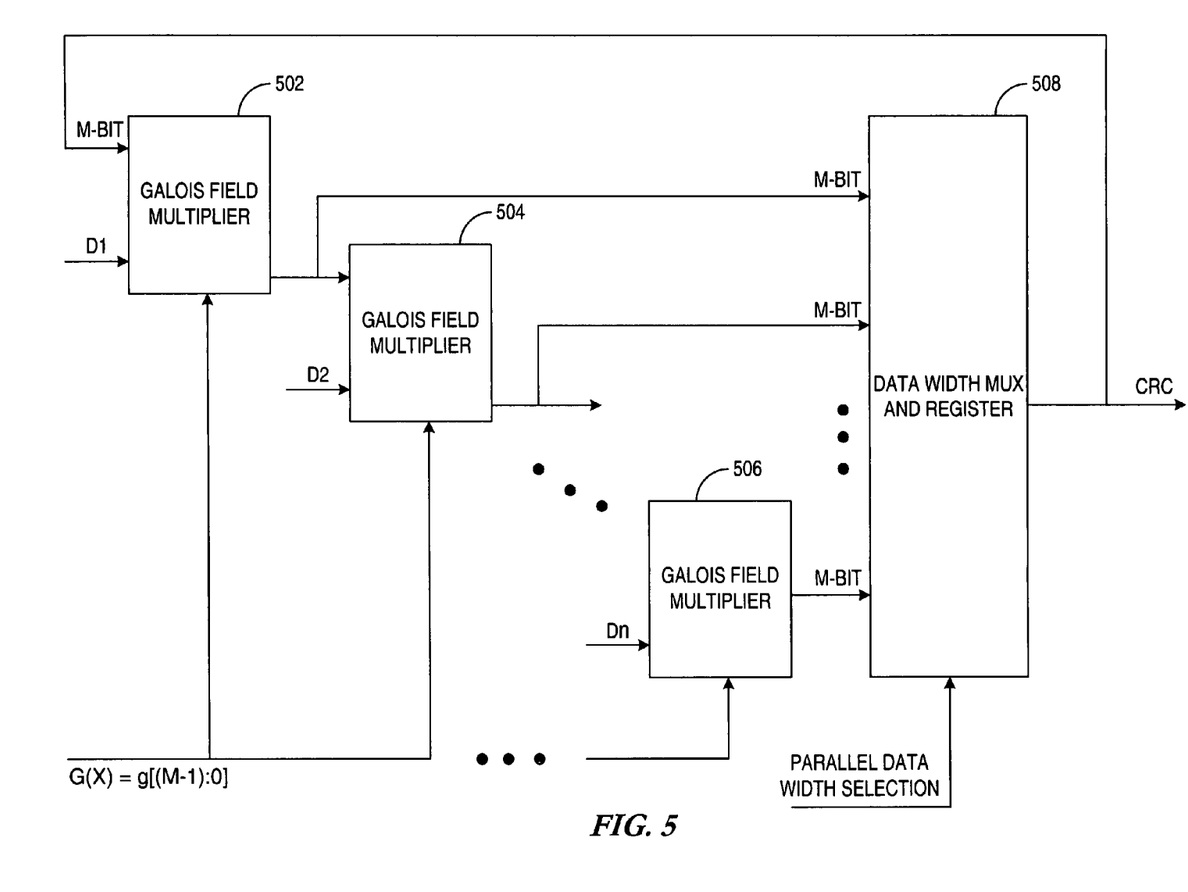
FIG. 5 illustrates an exemplary block diagram of a programmable modular CRC generation circuit.

In particular, each of Galois Field multipliers 502-506 represent identical, modular CRC calculation blocks. As discussed above, each of data input words D1, D2, . . . , Dn are restricted to a width, N, that is less than, or equal to, the order, M, of the Galois Field generator polynomial, G(X), being used. By cascading Galois Field multipliers 502-506 as shown, a total data width can be accommodated that is equal to n*N, where n is the number of Galois Field multipliers cascaded and N is the input data width in bits.

Each Galois Field multiplier block 502-506 may receive generator polynomial factors, G(x), corresponding to the Galois Field of interest. As such, the Galois Field is set by initially defining the size of the field and also the values those elements will possess, which are defined by the generator polynomial factors, G(x).

Next, the input data word is partitioned across n cascaded Galois Field multipliers, 502-504, as needed. In particular, the first N bits of D, e.g., D1, may be routed to Galois Field multiplier 502. The next N bits of D, e.g., D2, may be routed to Galois Field multiplier 504, and so on as needed by the width of word D. Finally, if needed, the last N bits of D, e.g., Dn, may be routed to Galois Field multiplier 506. As such, Galois Field multipliers 502-506 apply the Galois Field vector, G(x), to their respective input data segments, D1-Dn, to generate their respective M-bit results. Each M-bit result is then received by data width multiplexer and register (DWMR) 508 for appropriate data selection.

Given, for example, that a 64-bit result is required, a 64-bit data word, D, is used, assuming a 32-bit generator polynomial, G(X), is programmed, and an input data width, N=8, is selected, then a total of 8 Galois Field multipliers are needed. In this instance, the first 8 bits of data word D are passed to GF multiplier 502, the next 8 bits of data word D are passed to GF multiplier 504, and the operation is continued until the last GF multiplier, i.e., 506, is reached. Galois Field Multipliers 502-506 are multiplexed by DWMR 508 to provide the 32-bit output, selecting between the 32-bit outputs from the $1^{st}$ GF multiplier to the $8^{th}$ GF multiplier depending on the data width selected. For this example, the 32-bit output from the $8^{th}$ GF multiplier, which is the last of the GF Multiplier blocks, is selected.

Conversely, if for the same example, an input data width of N=32 were used, then only 4 Galois Field multipliers would be needed and DWMR 508 would multiplex a 32-bit output from the fourth GF Multiplier. It can be seen, therefore, that virtually any input data width can be accommodated, where an arbitrarily large input data width may be processed by cascading an appropriate number of Galois Field Multiplier modules 502-506 and selecting the appropriate output data via DWMR 508.

It should be noted that for Galois Field Multiplier based CRC calculations, as discussed above in relation to FIG. 4, an additional stage, which multiplies the result by an all zero input, is required. Thus, in relation to FIG. 5, an identical stage to FIG. 5 (except for the feedback connection) is cascaded in series, which accepts signal CRC as its M-bit input, where the D1-Dn inputs are all zeros. Alternately, the same operation could be achieved by reiterating through the same circuit with the data being set to 0s. The additional zero input stage is required for scrambler applications as discussed below in relation to FIG. 7, since valid outputs are required for every cycle.

In addition, Galois Field Multipliers 502-506 are initially set up as, for example, 32-bit multipliers to handle input data widths, D1-Dn, of 8-bits. It is possible to reprogram Galois Field Multipliers 502-506 with a different generator polynomial, G(x), as long as the order of the new generator polynomial meets certain design constraints. For example, changing the generator polynomial from G(32) to G(16) is possible, since the order, 16, is still an integer multiple of 8. Similarly, changing the generator polynomial from G(32) to G(24) is possible, since the order, 24, is still an integer multiple of 8.

Figure 6:
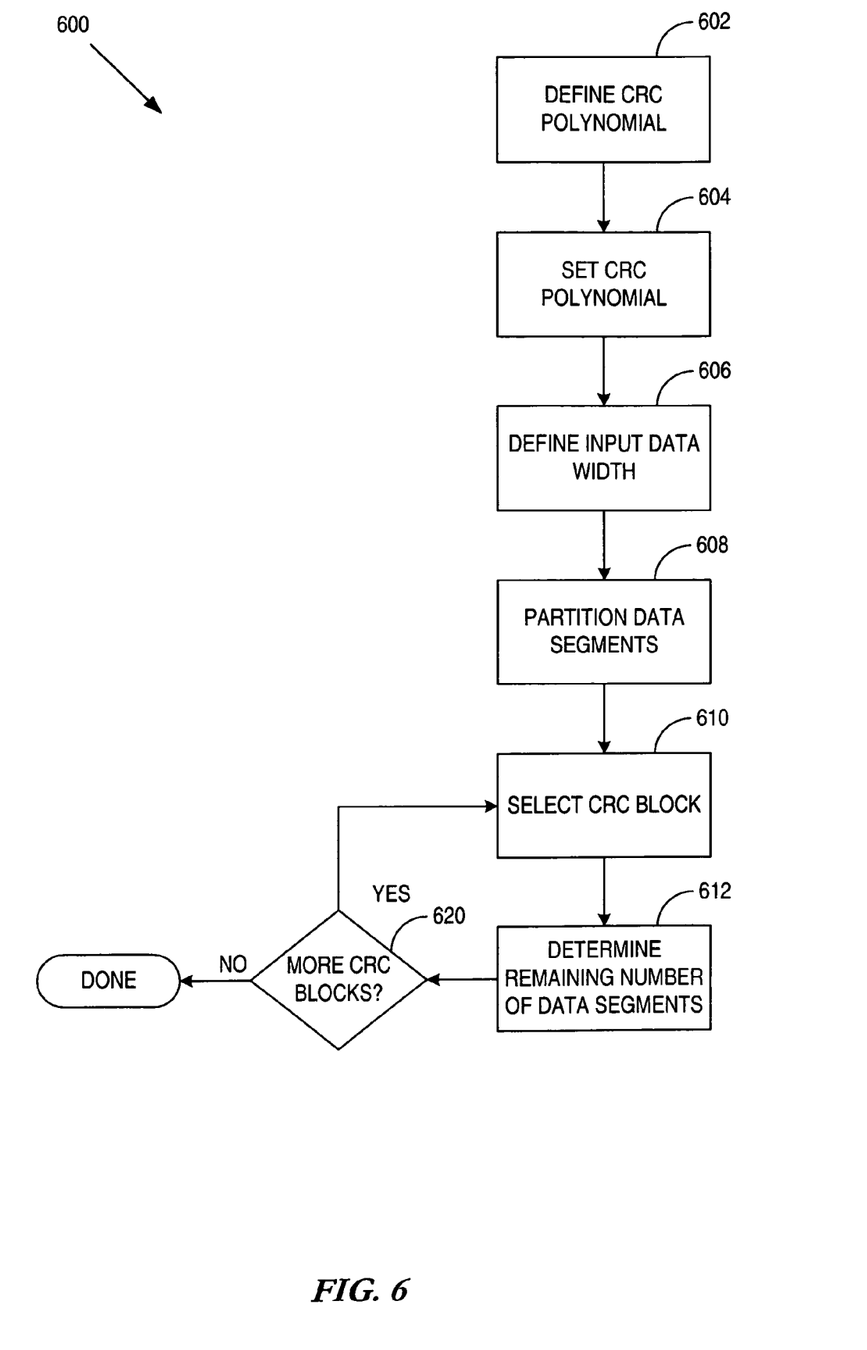
FIG. 6 illustrates an exemplary flow diagram of a design method for a programmable, modular CRC generator.

A generalized flow diagram of the design of a programmable, modular LFSR generator is exemplified in FIG. 6. As discussed above, an LFSR polynomial, that corresponds to a Galois Field, may be defined as in step 602 and programmed into the CRC core as in step 604 to define the operational CRC block. Additionally, an input data width may be selected as in step 606, such that division of the input data by the LFSR polynomial may be performed in accordance with the Galois Field mathematics as discussed above.

Depending upon the width of the input data word, multiple Galois Field multipliers may be necessary. For example, given an input data word width of 40 bits in conjunction with a 32-bit Galois Field polynomial, it can be seen that more than one Galois Field multiplier is necessary as determined in step 608. For example, if data segments, e.g., D1-Dn as illustrated in FIG. 5, are selected to be 8 bits in width, then a total of 5 (i.e., 5*8 bits=40 bits) Galois Field multipliers are necessary to accommodate the input data word width. The data and width selection is then applied to the first of 5 Galois Field multiplier blocks as in step 610 and are then selected as in step 612. In step 614, the number of remaining data bits are calculated and the need for a second Galois Field multiplier is detected in step 616. Steps 610 through 616 are repeated to setup the remaining Galois Field multipliers that are needed for the current design.

In an alternative embodiment, the number of Galois Field multipliers needed for a particular design may be limited. In such an instance, if the input data width exceeds the polynomial of the Galois Field multipliers being utilized, then multiple cycles may be processed through the existing Galois Field multipliers instead. In this way, the existing Galois Field multipliers may be reused through multiple cycles as opposed to cascading the required number of Galois Field multipliers to accommodate the data width in a single cycle.

Although various embodiments are disclosed as being operative with CRC algorithms, one of ordinary skill in the art will recognize relevant application, for example, to the field of data scramblers. In particular, the modular block diagram of FIG. 5 may be utilized to provide scrambling functionality in order to modify the incoming data blocks in accordance with the scrambling polynomials.

Figure 7:
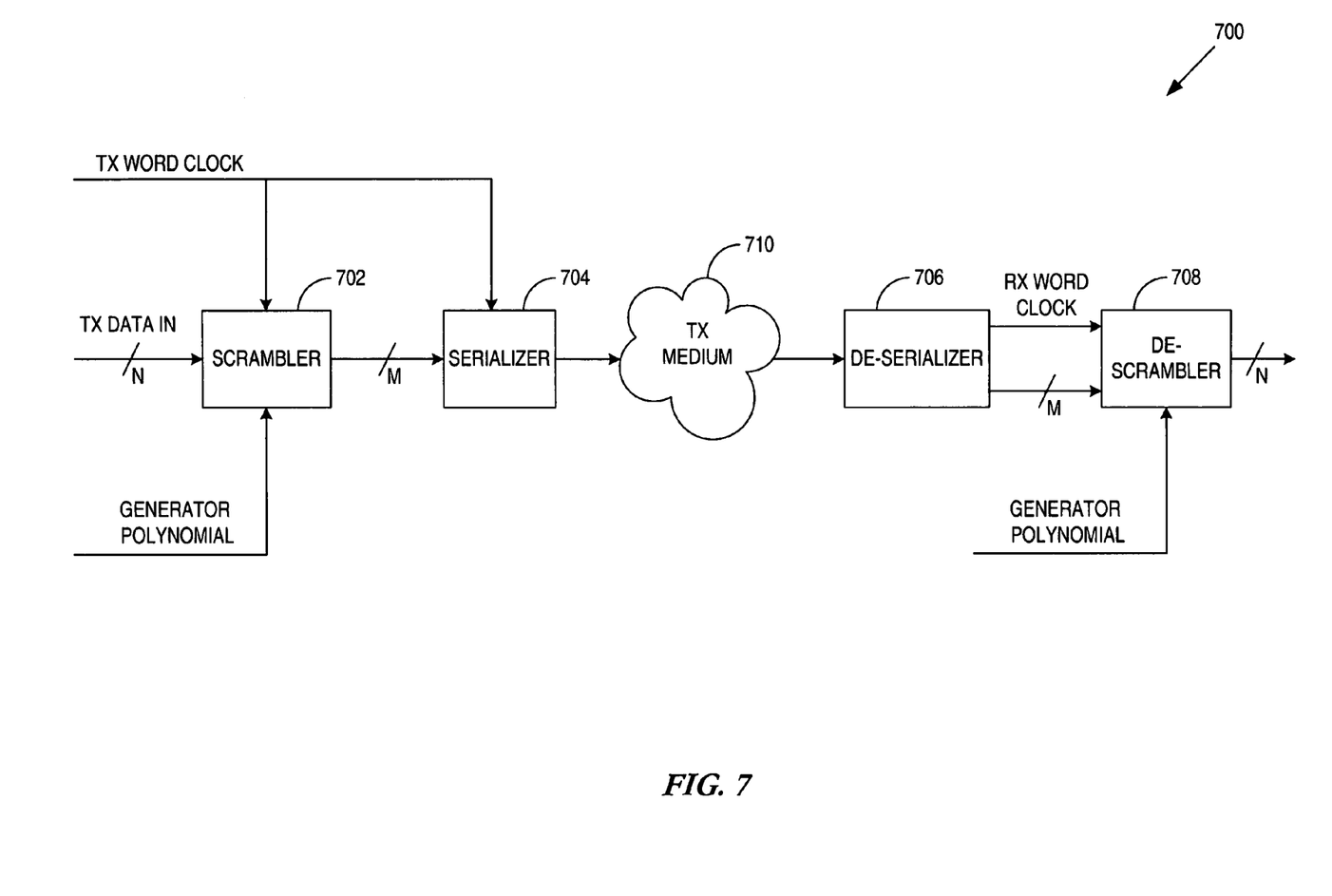
FIG. 7 illustrates an exemplary block diagram of a communication system utilizing a scrambler circuit.

FIG. 7 illustrates an exemplary block diagram of communication system 700 in which efficient scrambling is performed as may be required by various exemplary communication applications. In particular, scrambling serves several purposes, not the least of which allows the transmission of data between a transmitter and its corresponding receiver, while insuring a certain measure of security to prevent the unauthorized access of the data by third parties in transmission medium 710.

Another purpose for the use of scramblers may include "whitening" of the transmitted data, whereby through the use of the scramblers, run lengths of logic "1"s and "0"s may be minimized to some extent. Excessive run length mitigation is required by many synchronous communication protocols, such as SONET, since they depend on data transitions in the transmitted data to recover the transmission clock rate at the receiving end. If excessive run lengths of logic "1"s or "0"s are encountered, then the clock recovery systems may lose synchronization.

Taking communication system 700, for example, scrambling block 702 of communication system 700 accepts a data word of width, N, and scrambles it in accordance with the GENERATOR POLYNOMIAL to yield a scrambled result having a width of M, which is greater than or equal to the width of N. The GENERATOR POLYNOMIAL may be downloaded from a configuration module (not shown) located within a transmission portion of communication system 700. Scrambler 702 then scrambles the result in a manner that is identical to the discussion relating to FIG. 5 above.

Serializer 704 then creates a serial data stream from the scrambled data word and transmits the serial data stream to the intended receiver via transmission medium 710. Transmission medium may represent any wired or wireless medium as required by the particular application.

At the receiving end, de-serializer 706 receives the serial data stream, extracts the transmission clock from the received data, synchronizes the recovered clock to the received data stream, and forms the received data into scrambled data words having width M. De-scrambler 708 then applies GENERATOR POLYNOMIAL that was used by scrambler 702 in order to recover the transmitted data, TX DATA IN. It should be noted that continuous transmission of scrambled data is contemplated, such that the LFSR implementation of data scramblers as exemplified in FIG. 7 transmits the newly computed results at each transition of TX WORD CLOCK.

Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A programmable modular cyclic redundancy check (CRC) circuit to receive an input data word, comprising:
    a variable number of multiplier circuits coupled in series, each multiplier circuit coupled to receive a generator polynomial and a portion of the input data word received at the programmable modular CRC circuit and adapted to multiply the portion of the input data word by the generator polynomial to provide a result having a data width equal to an order of the generator polynomial, wherein the variable number of multiplier circuits is determined to be equal to a ratio of an input data word width to a width of the portion of the input data word; and
    a register circuit comprising a multiplexer coupled to receive the result from each of the plurality of multiplier circuits and adapted to select a final CRC result from a last multiplier circuit of the variable number of multiplier circuits.

2. The programmable modular CRC circuit of claim 1, wherein each multiplier circuit comprises a Galois Field multiplier block coupled to receive the generator polynomial.

3. The programmable modular CRC circuit of claim 2, wherein the Galois Field multiplier block of a first of the variable number of multiplier circuits is coupled to receive the final CRC result from the register circuit via a feedback path.

4. The programmable modular CRC circuit of claim 3, wherein the first of the variable number of multiplier circuits further comprises an exclusive-OR block coupled to receive a first portion of the input data word and the final CRC result and adapted to provide an exclusive-OR result.

5. The programmable modular CRC circuit of claim 4, wherein the Galois Field multiplier block of a remaining number of multiplier circuits is coupled to receive a CRC result of an immediately preceding multiplier circuit.

6. The programmable modular CRC circuit of claim 5, wherein the remaining number of multiplier circuits further comprises an excusive-OR block coupled to receive respective portions of the input data word and the CRC result of the immediately preceding multiplier circuit and adapted to provide an XOR result.

7. A method of generating CRC using a programmable modular cyclic redundancy check (CRC) circuit to receive an input data, the method comprising:
    defining a generator polynomial for use in each multiplier module of the CRC circuit;
    defining a multiplier data width to be processed by each multiplier module;
    determining a number of multiplier modules required to accommodate the input data width, wherein the number of multiplier modules is determined to be equal to a ratio of the input data width to a width of a portion of the input data;
    serially cascading the determined number of multiplier modules;
    coupling the portion of the input data to each cascaded multiplier module;
    multiplying, by each cascaded multiplier module, the portion of the input data by the generator polynomial to provide a result having a data width equal to an order of the generator polynomial;
    receiving, by a register circuit comprising a multiplexer, the result from each cascaded multiplier module; and
    selecting a final CRC result from a last multiplier module of the cascaded multiplier modules.

8. The method of claim 7, wherein defining a generator polynomial comprises defining a Galois Field multiplier polynomial having an order that exceeds or equals the multiplier data width.

9. The method of claim 8, wherein the multiplier data width is less than or equal to the input data width.

* * * * *